United States Patent
Gopal Krishnan et al.

(10) Patent No.: US 11,619,828 B2
(45) Date of Patent: Apr. 4, 2023

(54) TRANSMISSION BEAM SPLITTER

(71) Applicant: STMICROELECTRONICS (RESEARCH & DEVELOPMENT) LIMITED, Marlow (GB)

(72) Inventors: Thineshwaran Gopal Krishnan, Edinburgh (GB); Christopher Townsend, Edinburgh (GB)

(73) Assignee: STMICROELECTRONICS (RESEARCH & DEVELOPMENT) LIMITED, Marlow (GB)

( * ) Notice: Subject to any disclaimer, the term of this patent is extended or adjusted under 35 U.S.C. 154(b) by 595 days.

(21) Appl. No.: 16/746,670

(22) Filed: Jan. 17, 2020

(65) Prior Publication Data

US 2021/0223562 A1 Jul. 22, 2021

(51) Int. Cl.
*G02B 27/30* (2006.01)
*G02B 27/12* (2006.01)
*G02B 3/00* (2006.01)

(52) U.S. Cl.
CPC ........... *G02B 27/30* (2013.01); *G02B 3/0062* (2013.01); *G02B 27/123* (2013.01); *G02B 2003/0093* (2013.01)

(58) Field of Classification Search
CPC .... G02B 3/0056; G02B 3/0043; G02B 5/001; G02B 27/123; G02B 13/18; H01S 3/005; G01D 5/347–5/34723; G01S 17/04
USPC .......................... 359/741–743, 641; 362/244
See application file for complete search history.

(56) References Cited

U.S. PATENT DOCUMENTS

| | | | | |
|---|---|---|---|---|
| 4,767,172 A | * | 8/1988 | Nichols ................ | G02B 6/4214 355/1 |
| 5,572,367 A | | 11/1996 | Jung et al. | |
| 7,817,909 B2 | * | 10/2010 | Montgomery ....... | G02B 27/095 359/743 |
| 7,887,197 B2 | * | 2/2011 | Iwanaga .................... | F21V 5/04 353/100 |
| 7,967,479 B2 | * | 6/2011 | Dubuc ....................... | F21V 5/04 362/311.06 |
| 8,220,975 B2 | * | 7/2012 | Miyashita ............... | F21V 5/045 362/327 |
| 8,558,161 B2 | * | 10/2013 | Ong ...................... | G02B 19/008 250/221 |
| 8,969,784 B2 | * | 3/2015 | Fouquet ............. | G02B 19/0028 250/221 |
| 9,080,742 B2 | * | 7/2015 | Otsuka ..................... | F21S 41/18 |
| 10,957,829 B2 | * | 3/2021 | Thombre ............... | G02B 27/30 |

(Continued)

FOREIGN PATENT DOCUMENTS

| | | |
|---|---|---|
| CN | 1677050 A | 10/2005 |
| CN | 104898125 A | 9/2015 |

(Continued)

*Primary Examiner* — Zachary W Wilkes
(74) *Attorney, Agent, or Firm* — Seed IP Law Group LLP

(57) ABSTRACT

The present disclosure is directed to an electronic device including a sensor having a transmission module configured to provide a plurality of collimated light beams. The transmission module includes a light source and a transmission beam splitter. The transmission beam splitter includes a plurality of lenslets. The transmission beam splitter is configured to receive one or more light beams from the light source and refract the one or more light beams for forming the plurality of collimated light beams.

17 Claims, 5 Drawing Sheets

(56) References Cited

U.S. PATENT DOCUMENTS

| | | | |
|---|---|---|---|
| 2010/0208487 A1* | 8/2010 | Li | G02B 6/32 362/555 |
| 2012/0037793 A1 | 2/2012 | Ong et al. | |
| 2012/0206620 A1 | 8/2012 | Findlay et al. | |
| 2015/0226839 A1* | 8/2015 | Brandl | G01S 7/4816 250/221 |
| 2017/0248783 A1 | 8/2017 | Gruhlke | |
| 2018/0143359 A1 | 5/2018 | Channon et al. | |
| 2018/0164411 A1 | 6/2018 | Townsend | |
| 2020/0194973 A1* | 6/2020 | Bloemen | G02B 3/0062 |
| 2022/0011435 A1* | 1/2022 | Belmonte Palermo | G01S 7/4814 |

FOREIGN PATENT DOCUMENTS

| | | |
|---|---|---|
| CN | 106062475 A | 10/2016 |
| CN | 106896369 A | 6/2017 |

\* cited by examiner

TRANSMISSION BEAM SPLITTER

BACKGROUND

Technical Field

The present application is directed generally to beam splitting, and more specifically, to transmission beam splitting.

Description of the Related Art

Proximity sensors, sometimes referred to as ranging sensors, are often used to detect a distance to a target object. Generally, proximity sensors include a transmitter that transmits a light signal at the target object, and a receiver that receives the light signal reflected from the target object back to the sensor. The distance from the sensor to the target object is then calculated based on the received light signal in a time-of-flight analysis.

Time-of-flight analyses for multiple target objects and/or for multiple points on a single target object are more complex, typically utilizing multiple light sources and/or multiple optical structures. There is a need for a compact, cost effective system that may be used to implement time-of-flight analyses for multiple target objects and/or for multiple points on a single target object.

BRIEF SUMMARY

Embodiments of the present disclosure are directed to electronic devices and components of electronic devices that provide collimated light beams from one or more light beam sources. Embodiments of the present disclosure may be used in conjunction with systems and methods for time-of-flight analyses.

In one embodiment, an electronic device is provided that includes a sensor having a transmission module configured to transmit a plurality of collimated light beams. The transmission module may include a light source and a transmission beam splitter. The transmission beam splitter may include a plurality of lenslets. The transmission beam splitter is configured to receive one or more light beams from the light source and refract the one or more light beams for forming the plurality of collimated light beams.

In another embodiment, a sensor for use in an electronic device is provided. The sensor may include a transmission module configured to split one or more light beams into a plurality of collimated light beams. The transmission module may include a vertical-cavity surface-emitting laser (VCSEL) light source including one or more emitters for generating the one or more light beams, and a transmission beam splitter including a plurality of lenslets. Each lenslet is configured to receive one or more light beams for generating one or more respective collimated light beams. Each lenslet has an inner surface and an outer surface, and the one or more light beams enter each lenslet through the inner surface and exit each lenslet through the outer surface.

In one embodiment, three-dimensional shapes of the outer and inner surfaces of each lenslet are configured such that one or more light beams passing through each lenslet are refracted to form one or more respective collimated light beams.

In another embodiment, a transmission beam splitter is provided. The transmission beam splitter has a longitudinal axis and includes a plurality of lenslets. The plurality of lenslets may include a center lenslet positioned on the longitudinal axis and a plurality of peripheral lenslets positioned circumferentially around the longitudinal axis. Each peripheral lenslet has a top edge connecting with a portion of a circumferential edge of the center lenslet, and each peripheral lenslet has two side edges. Each side edge of each peripheral lenslet connects with a side edge of an adjacent peripheral lenslet. Each lenslet has an inner surface and an outer surface.

In an embodiment, three-dimensional shapes of the outer and inner surfaces of each lenslet are configured such that one or more light beams passing through each lenslet are refracted to form one or more respective collimated light beams. In one embodiment, the one or more respective collimated light beams having different propagation directions.

BRIEF DESCRIPTION OF THE SEVERAL VIEWS OF THE DRAWINGS

In the drawings, identical reference numbers identify similar features or elements. The size and relative positions of features in the drawings are not necessarily drawn to scale.

DETAILED DESCRIPTION

In the following description, certain specific details are set forth in order to provide a thorough understanding of various aspects of the disclosed subject matter. However, the disclosed subject matter may be practiced without these specific details. In some instances, well-known structures and methods of manufacturing electronic devices, optical lenses, and sensors have not been described in detail to avoid obscuring the descriptions of other aspects of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting or glass substrates, whether or not the components are coupled together into a circuit or able to be interconnected. Throughout the specification, the term "layer" is used in its broadest sense to include a thin film, a cap, or the like, and one layer may be composed of multiple sub-layers.

It is noted that the dimensions set forth herein are provided as examples. Other dimensions are envisioned for this embodiment and all other embodiments of this application.

Figure 1:
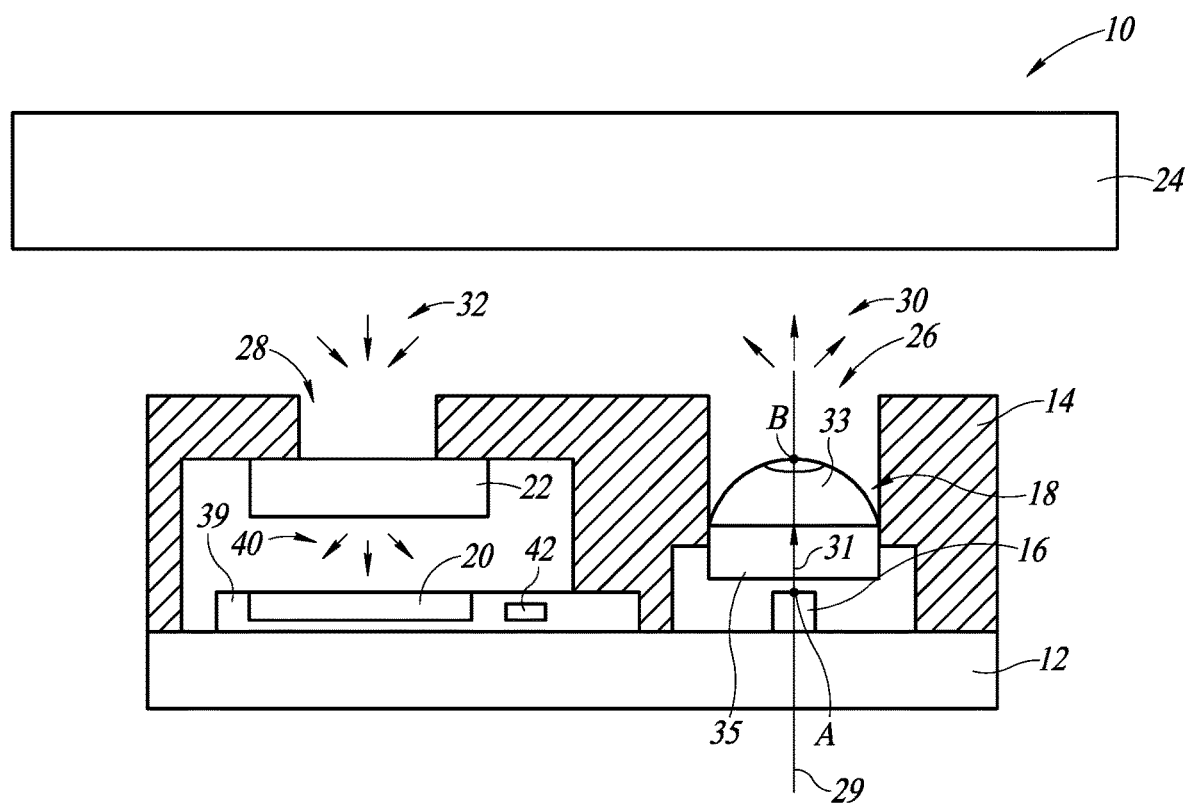
FIG. 1 is a schematic of a sensor according to an embodiment of the present disclosure.

FIG. 1 is a diagram of a sensor 10, according to an embodiment of the present disclosure. The sensor 10 determines a distance between the sensor 10 and one or more target objects (i.e., one or more points on the surfaces of one or more target objects) external to the sensor 10. In one embodiment, the sensor 10 is a time-of-flight sensor.

The sensor 10 may be included in various electronic devices, such as mobile handsets, cameras, tablets, laptops, and computers, for a variety of different applications. For example, the sensor 10 may be incorporated into a mobile handset and used in conjunction with a camera to adjust a focus or a flash of the camera.

The sensor 10 includes a substrate 12, a body 14, a light source 16, a transmitting optical structure 18, a detector 20, a receiving optical structure 22, and a cover 24. The light source 16 and the transmitting optical structure 18 may collectively be referred to as a transmission module, and the receiving optical structure 22 and the detector 20 may collectively be referred to as a receiving module.

The substrate 12 provides a support platform for the sensor 10. The body 14, the light source 16, the transmitting optical structure 18, the detector 20, and the receiving optical structure 22 are positioned on the substrate 12. The substrate may be any type of rigid material, such as plastic, metal, glass, and semiconductor material. In one embodiment, the substrate 12 is a printed circuit board that includes one or more electrical components (e.g., capacitors, transistors, processors, etc.).

The substrate 12 and the body 14, together, form an enclosure or package that contains the light source 16, the transmitting optical structure 18, the detector 20, and the receiving optical structure 22. The substrate 12 and the body 14 protect the light source 16, the transmitting optical structure 18, the detector 20, and the receiving optical structure 22 from an external environment. The body 14 includes an output aperture 26 and a detection aperture 28. As illustrated, the transmitting optical structure 18 has a longitudinal axis 29. In some embodiments, the longitudinal axis 29 is an axis of symmetry of the transmitting optical structure 18 and/or the output aperture 26. In other embodiments, the longitudinal axis 29 passes through the geometric center of the output aperture 26.

In one embodiment, the output aperture 26 directly overlies and is aligned with the light source 16 and the transmitting optical structure 18. The output aperture 26 provides a hole for a light signal 30 (also referred to as one or more light beams) to pass through. The light signal 30 is a light signal or photons emitted from the light source 16 and directed to one or more target objects for which multiple distances between the one or more target objects and the sensor 10 are being determined. As illustrated, the transmitting optical structure 18 receives a light beam 31 from the light source 16 and emits the light signal 30 (i.e., the three light beams 30).

However, and as discussed further below in conjunction with the light source 16 and the transmitting optical structure 18, the scope of the disclosure covers any number of light beams 31 from the light source, and for each light beam 31 received by the transmitting optical structure 18, a plurality of light beams 30 are emitted from the transmitting optical structure 18. In one embodiment, the transmitting optical structure 18 is a transmission beam splitter 18.

The detection aperture 28 directly overlies and is aligned with the detector 20 and the receiving optical structure 22. The detection aperture 28 provides a hole for a light signal 32 to pass through. The light signal may include any number of light beams 32. The light beams 32 are the reflection of the light beams 30 from one or more objects (e.g., one or more target objects).

In one embodiment, the light source 16 emits one or more light beams 31, which are refracted upon passing through the transmission beam splitter 18, thereby forming one or more collimated light beams 30 that pass through the output aperture 26. In one embodiment, and as discussed in more detail further below, the light source 16 is an infrared or near infrared light source, such as a vertical-cavity surface-emitting laser (VCSEL).

In one embodiment, the transmission beam splitter 18 has a transparent top portion 33 and an opaque base portion 35. In one embodiment, the transmission beam splitter 18 is physically coupled to the substrate 12 via the base portion 35. For example, in one embodiment, the transmission beam splitter 18 is positioned in the output aperture 26 and attached to the body 14 by adhesive. In one embodiment, the top portion 33 of the transmission beam splitter 18 is made of one or more transparent materials. For example, in one embodiment, the top portion 33 is made of one or more of the following: silicon (Si), silicon dioxide, (SiO2), zinc sulphide (ZnS), gallium nitride (GaN), zinc selenide (ZnSe), titanium dioxide (TiO2), silicon carbide (SiC), gallium phosphide (GaP), gallium arsenide (GaAs), and hydrogenated silicon (Si:H).

The detector 20 is positioned on the substrate 12. The detector 20 directly underlies and is aligned with the receiving optical structure 22 and the detection aperture 28. In one embodiment, the detector 20 is integrated into a semiconductor substrate 39. The substrate 39 may include various electrical components (e.g., transistors, capacitors, resistors, processors, etc.) and devices (e.g., a reference sensor array).

The detector 20 receives one or more light beams 40, which are the result of the light beams 30 being reflected off one or more target objects, passing through the detection aperture 28, and being optically processed by the receiving optical structure 22. The detector 20 includes a plurality of photodetectors that sense or measure the light beams 40. The detector 20 may be any type of sensors that measure light signals. In one embodiment, the detector 20 is a single-photon avalanche diode (SPAD) array.

In one embodiment, the receiving optical structure 22 has one or more optical functions. For example, in one embodiment, the receiving optical structure 22 has a beam shaping function, an imaging function, a collimating function, a diffusing function, a polarizing function, a beam splitting function, a wavefront coding function, or a combination thereof.

In one embodiment, the receiving optical structure 22 is made of a single transparent material (i.e., monolithic). In one embodiment, the receiving optical structure 22 is made of one or more transparent materials. For example, the receiving optical structure 22 may include one or more of the following: silicon (Si), silicon dioxide, (SiO2), zinc sulphide (ZnS), gallium nitride (GaN), zinc selenide (ZnSe), titanium dioxide (TiO2), silicon carbide (SiC), gallium phosphide (GaP), gallium arsenide (GaAs), and hydrogenated silicon (Si:H).

The cover 24 overlies and is aligned with the sensor 10. The cover 24 protects the sensor 10 from a surrounding environment. In one embodiment, the cover 24 is a component of the electronic device in which the sensor 10 is included. For example, the cover 24 may be a protective layer of glass of a mobile handset.

In one embodiment, the cover 24 is made of one or more transparent materials. For example, the cover 24 may include one or more of the following: glass, plastic, silicon (Si), silicon dioxide, (SiO2), zinc sulphide (ZnS), gallium nitride (GaN), zinc selenide (ZnSe), titanium dioxide (TiO2), silicon carbide (SiC), gallium phosphide (GaP), gallium arsenide (GaAs), and hydrogenated silicon (Si:H).

In operation, the sensor 10 determines a distance between the sensor 10 and one or more target objects in a surrounding environment. The light source 16 transmits the one or more light beams 31, which are split into a plurality of collimated light beams 30 by the transmission beam splitter 18. The plurality of collimated light beams 30 pass through the output aperture 26, impinging on, and bring reflected by, one or more target objects. The detector 20 receives, through the detection aperture 28 and the receiving optical structure 22, the one or more light beams 40, which are the reflections of the plurality of collimated light beams 30 from the one or more target objects.

In one embodiment, a processor 42 uses the transmission of the one or more light beams 31 and the reception of the one or more light beams 40 in a time-of-flight analysis to determine the time of flight for each of the one or more light beams 31 to travel from the light source 16, to one or more target objects, and back to the detector 20. A distance between the sensor 10 and one or more target objects is then determined based on the time of flight. In one embodiment, the processor 42 uses an indirect time of flight method in which each of the light beams 31 are modulated to form a modulated signal, and the processor 42 determines a distance between the sensor 10 and the one or more target objects based on the relative phases between the one or more source light beams 31 and the corresponding one or more received light beams 40. In one embodiment, the distance between the sensor 10 and one or more target objects is determined based on the relative intensities of the one or more source light beams 31 and the corresponding one or more received light beams 40. Other methods are also possible.

Figure 2:
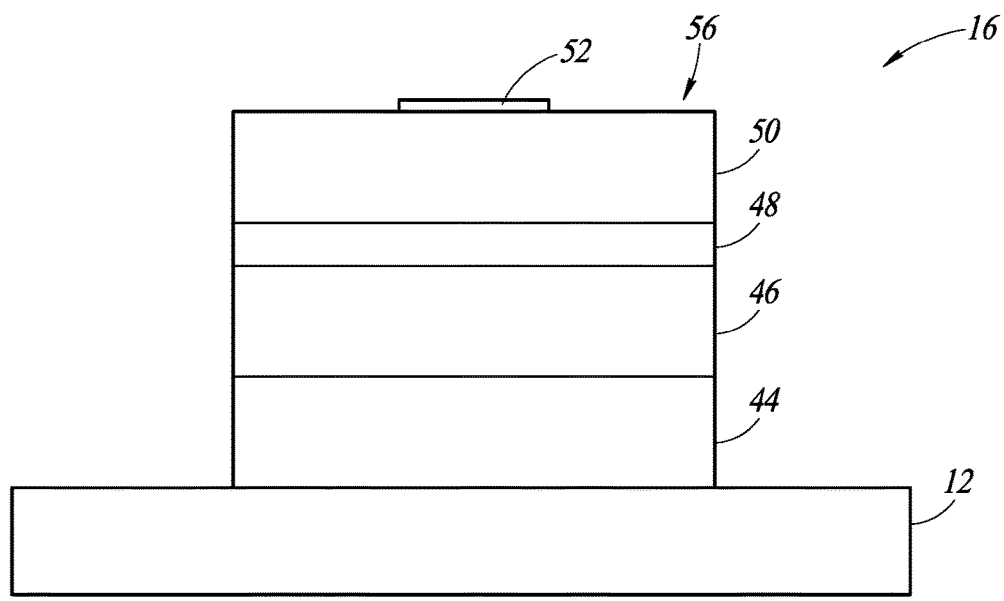
FIG. 2 is a side view of the VCSEL light source of FIG. 1, according to an embodiment of the present disclosure.

FIG. 2 is a side view of the VCSEL light source 16, according to an embodiment of the present disclosure. In one embodiment, the VCSEL light source 16 includes a substrate 44 on the substrate 12, a first mirror 46 on the substrate 44, an active layer 48 on the first mirror 46, a second mirror 50 on the active layer 48, a conductive contact 52 on the second mirror 50, and one or more emitters (FIG. 3) on or in the second mirror 50. In one embodiment, the substrate 44 is a semiconductor substrate.

The first mirror 46 and the second mirror 50 are highly reflective mirrors. In one embodiment, each of the first mirror 46 and the second mirror 50 has reflectivity between 99 and 99.9%. In one embodiment, the first mirror 46 has a higher reflectivity than the second mirror 50. In one embodiment, the first mirror 46 and the second mirror 50 are distributed Bragg reflectors.

The active layer 48 is positioned between the first mirror 46 and the second mirror 50. The active layer 48 includes one or more laser cavities. In one embodiment, the active layer 48 includes one or more quantum wells. The active layer 48 generates light when an electrical signal is applied to the active layer 48.

In one embodiment, the first mirror 46 and the second mirror 50 are oppositely doped from each other such that the first mirror 46, the active layer 48, and the second mirror 50 forms a p-i-n junction. For example, in one embodiment, the first mirror 46 has an n-type conductivity type and the second mirror 50 has a p-type conductivity type. Conversely, in another embodiment, the first mirror 46 has a p-type conductivity type and the second mirror 50 has an n-type conductivity type. In one embodiment, the substrate 44 has the same conductivity type as the first mirror 46.

Figure 3:
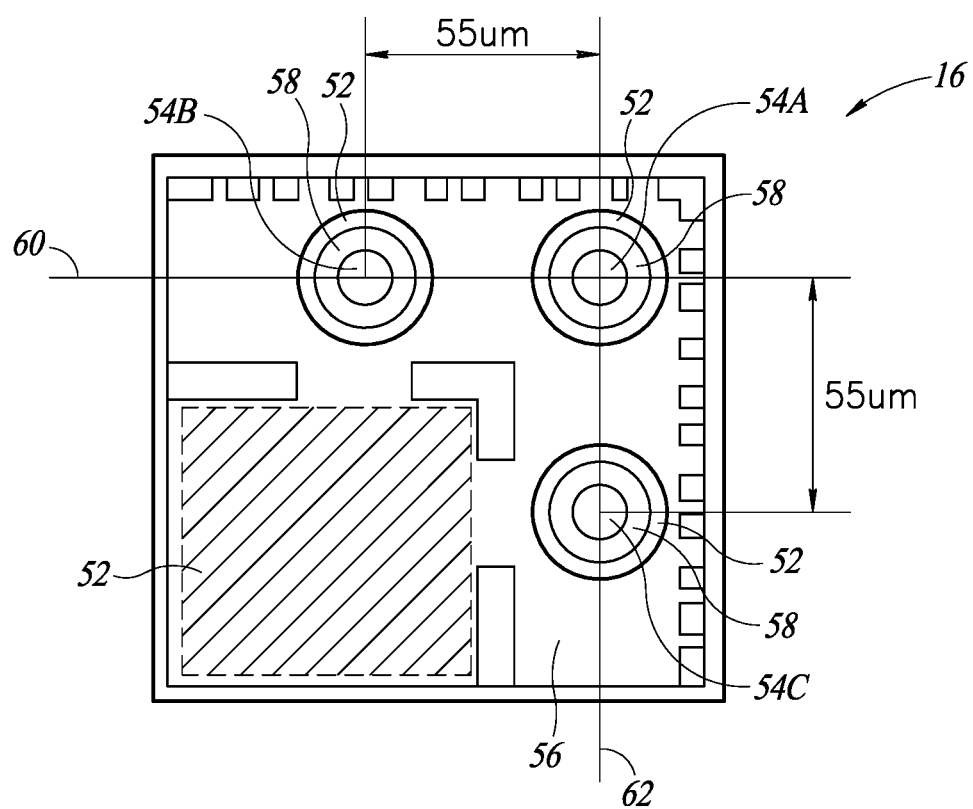
FIG. 3 is a top-down view of the VCSEL light source of FIG. 2, according to an embodiment of the present disclosure.

The conductive contact 52 is formed on an upper surface 56 of the second mirror 50. The conductive contact 52 is made of a conductive material, such as gold. The conductive contact 52 receives an electrical signal (e.g., voltage or current signal) from a driver circuit positioned on, for example, the substrate 12. Although not shown in FIG. 2, the VCSEL light source 16 may include another conductive contact to receive an electrical signal. For example, in one embodiment, the VCSEL light source 16 includes a conductive contact formed between the substrate 12 and the substrate 44. As shown in FIG. 3, in one embodiment, the conductive contact 52 includes portions that fully surround each of the one or more the emitters 54A, 54B, and 54C.

FIG. 3 is a top-down view of the VCSEL light source 16, according to an embodiment of the present disclosure. Referring to FIGS. 2 and 3, the emitters 54A, 54B, and 54C are formed on or in the second mirror 50. The emitters 54A, 54B, and 54C provide windows for light, generated by the active layer 48, to be emitted from the VCSEL light source 16. In one embodiment, the shape of the emitters 54A, 54B, and 54C are formed by one or more blocking layers formed within the VCSEL light source 16. For example, the emitters 54A, 54B, and 54C may be windows (i.e., through-holes) formed in an oxide layer 58. The oxide layer 58 may be positioned between the active layer 48 and the second mirror 50, between the active layer 48 and the first mirror 46, between the substrate 44 and the first mirror 46, and/or on the upper surface 56 of the second mirror 50. Although three emitters 54A, 54B, and 54C are shown in the embodiment of FIG. 3, the VCSEL light source 16 may include any number of emitters 54A, 54B, and 54C. For example, embodiments including a VCSEL light source 16 having one to six emitters 54A, 54B, and 54C are particularly contemplated. As illustrated, in one embodiment, the emitters 54A, 54B, and 54C form the vertices of a right triangle, with an axis 60 on which the emitters 54A and 54B lie forming a right angle with an axis 62 on which the emitters 54A and 54C lie. In one embodiment, the distance between emitters 54A and 54B is 55 um, and the distance between emitters 54A and 54C is 55 um. However, the scope of the present disclosure covers other configurations of emitters and other distances between emitters.

In operation, the conductive contact 52 receives an electrical signal (e.g., voltage or current signal) from a driver circuit positioned on, for example, the substrate 12. In response, photons are generated by the quantum well of the active layer 48. As the first mirror 46 and the second mirror 50 are highly reflective, the photons bounce between the first mirror 46 and the second mirror 50 and are emitted from the emitters 54A, 54B and 54C as three concentrated (i.e., intense) light beams.

Figure 4A:
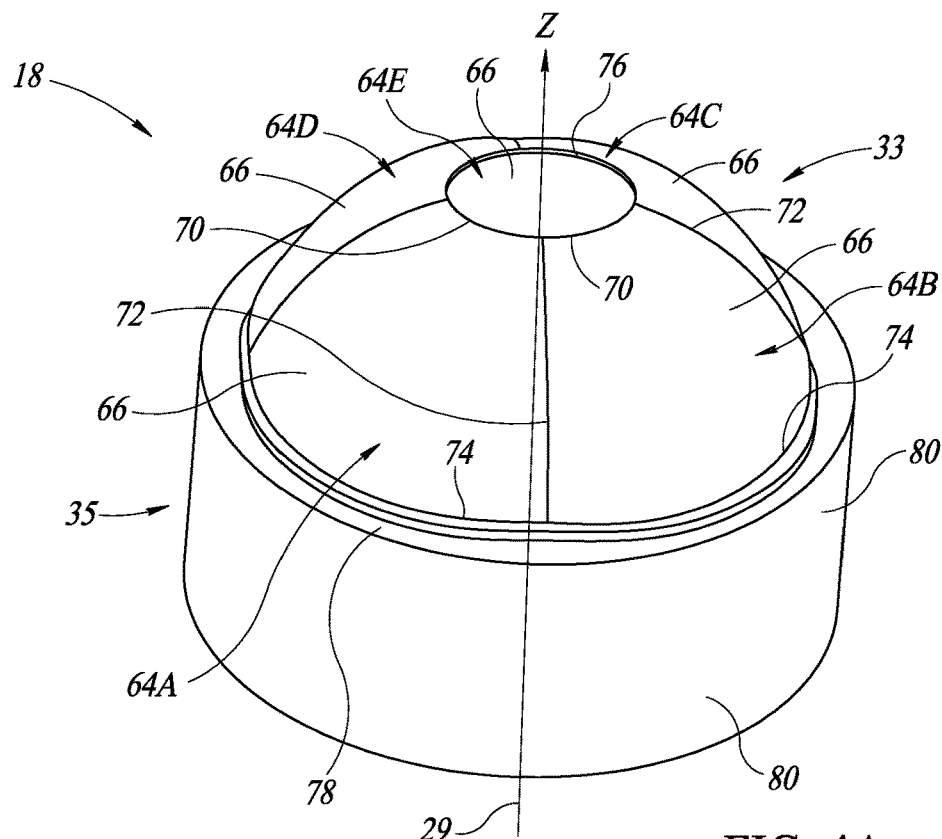
FIG. 4A is a three-dimensional perspective from above the transmission beam splitter of FIG. 1, according to an embodiment of the present disclosure.
Figure 4B:
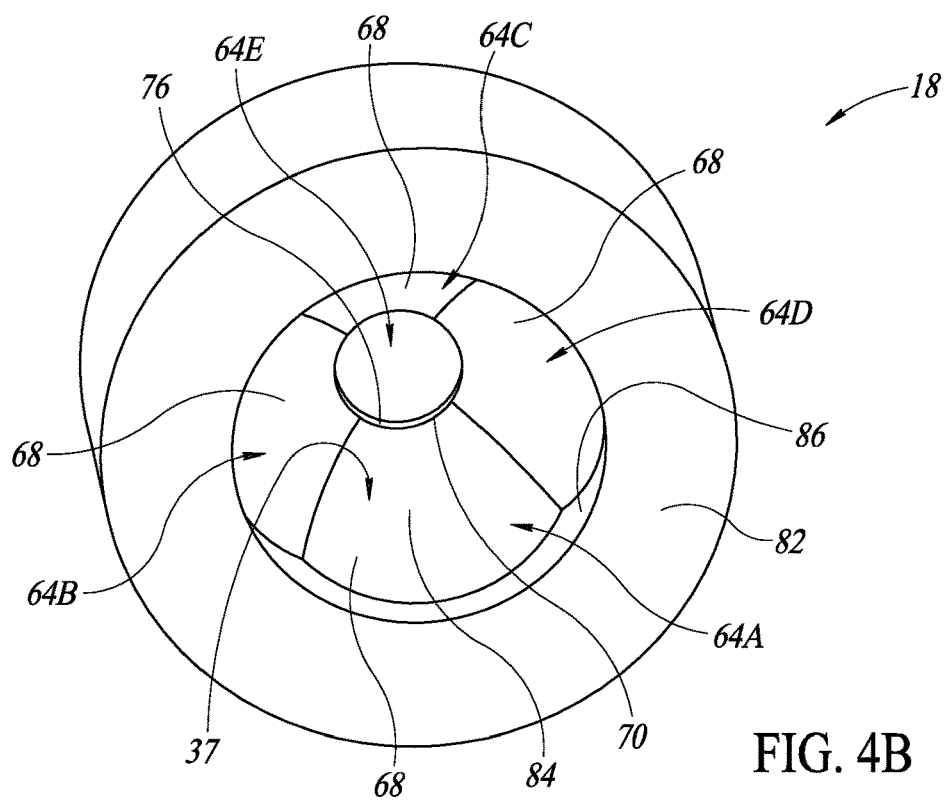
FIG. 4B is a three-dimensional perspective from below the transmission beam splitter of FIG. 1, according to an embodiment of the present disclosure.

FIG. 4A is a three-dimensional perspective from above the transmission beam splitter 18 and FIG. 4B is a three-dimensional perspective from below the transmission beam splitter 18, according to embodiments of the present disclosure. It is beneficial to review FIGS. 4A and 4B together. The top portion 33 of the transmission beam splitter 18 includes a plurality of lenslets. Each of the lenslets is an optical lens configured to refract a light signal from a light source (e.g., the light beam 31 from the light source 16). In one embodiment, the transmission beam splitter 18 has four peripheral lenslets 64A-64D and a center lenslet 64E, however the scope of the present disclosure covers any number of peripheral lenslets. As illustrated, the longitudinal axis 29 of the transmission beam splitter 18 (also referred to as the z-axis) passes through the center lenslet 64E. In one embodiment, the z-axis is an axis of symmetry of the center lenslet 64E. As illustrated, each of the lensets 64A-64E have a respective outer surface 66, and each of lenslets 64A-64E have a respective inner surface 68. Furthermore, each of the peripheral lensets 64A-64D have a respective top edge 70, each of peripheral lenslets 64A-64D have respective side edges 72, and each of the peripheral lenslets 64A-64D have a respective bottom edge 74. The center lenslet 64E has a circumferential edge 76. The base 35 of the transmission beam splitter 18 includes an upper circumferential portion 78, a side circumferential portion 80 and a bottom circumferential portion 82.

In one embodiment, the top edge 70 of each peripheral lenslet 64A-64D is physically coupled with a respective portion of the circumferential edge 76 of the center lenslet 64E, the side edges 72 of each peripheral lenslet 64A-64D are physically coupled with respective side edges 72 of different adjacent peripheral lenslets 64A-64D, and the bottom edge 74 of each peripheral lenslet 64A-64D is physically coupled with a respective portion of the upper circumferential portion 78 of the base 35. The transmission beam splitter includes a cavity 37, formed by the inner surfaces 68 of the lenslets 64A-64E and an inner surface 86 of the side circumferential portion 80 of the base 35. In one embodiment, the VCSEL light source 16 is positioned below and/or within the cavity 37 such that the one or more light beams 31 emitted from the one or more emitters 54A, 54B, and 54C are transmitted through, and refracted by, the lenslets 64A-64E, thereby forming one or more collimated light beams from each lenslet. The one or more light beams 31 from the VCSEL light source 16 enter each lenslet 64A-64E through a respective inner surface 68 and exit each lenslet 64A-64E through a respective outer surface 66.

In an embodiment, and as discussed further below in conjunction with FIGS. 5A, 5B, and 6, a three-dimensional shape of the outer and inner surface 66, 68 of each lenslet 64A-64E is formed (i.e., designed) such that one or more light beams from the VCSEL light source 16 passing through each lenslet 64A-64E are refracted to form one or more respective collimated light beams, each having at least an approximately different propagation direction.

Figure 5A:
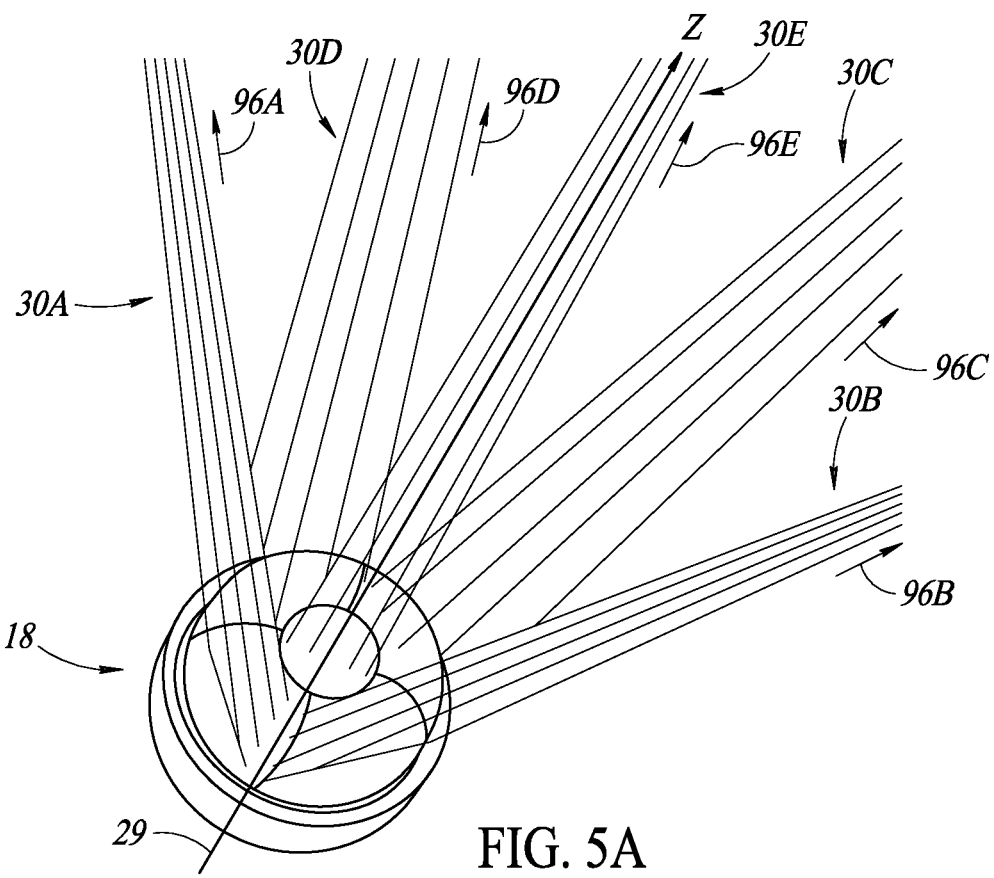
FIG. 5A illustrates the transmission beam splitter of FIG. 4 providing five collimated light beams, according to an embodiment of the present disclosure.

FIG. 5A illustrates the transmission beam splitter 18 of FIGS. 1 and 4 providing the collimated beams of light 30, according to an embodiment of the present disclosure. If the VCSEL light source 16 has only one emitter, such as the emitter 54A for example, then the transmission beam splitter 18 (having m=5 lenslets 64A-64E) form five collimated light beams (i.e., the collimated light beam 30A representing the refraction/collimation of the light beam 31 through the peripheral lenslet 64A, the collimated light beam 30B representing the refraction/collimation of the light beam 31 through the peripheral lenslet 64B, the collimated light beam 30C representing the refraction/collimation of the light beam 31 through the peripheral lenslet 64C, the collimated light beam 30D representing the refraction/collimation of the light beam 31 through the peripheral lenslet 64D, and the collimated light beam 30E representing the refraction/collimation of the light beam 31 through the center lenslet 64E). As illustrated, the collimated light beams 30A-30E have different propagation directions 96A-96E.

In another embodiment, in which the VCSEL light source 16 has a plurality of n emitters, such as n=3 emitters (i.e., 54A, 54B, 54C), then the transmission beam splitter 18 (having m=5 lenslets 64A-64E) form n×m=15 collimated light beams (i.e., each lenslet 64A-64E refracts/collimates three closely spaced light beams (represented by the beam 31) to form three closely spaced collimated light beams, where each of the three closely spaced collimated light beams formed by the refraction/collimation of light by each lenslet 64A-64E is represented by each of the collimated light beams 30A-30E.

In one embodiment of the disclosure, the dimensions of the transmission beam splitter (e.g., diameter of the base 35 and/or top portion 33) is on the order of millimeters, and the dimension of the VCSEL light source 16 (e.g., the spacing between emitters) is on the order of microns. Thus, each lenslet 64A-64E refracts/collimates the received one or more light beams from the VCSEL light source 16 to provide one or more respective collimated light beams spaced closely together (as compared to the dimension of the beam splitter 18) and having approximately the same propagation direction. Thus, in the embodiment in which the VCSEL light source 16 has three emitters, each lenslet 64A-64E provides three collimated light beams (i.e., collimated light beam 30A includes three closely spaced collimated light beams having approximately the same propagation direction, collimated light beam 30B includes three closely spaced collimated light beams having approximately the same propagation direction, collimated light beam 30C includes three closely spaced collimated light beams having approximately the same propagation direction, collimated light beam 30D includes three closely spaced collimated light beams having approximately the same propagation direction, and collimated light beam 30E includes three closely spaced collimated light beams having approximately the same propagation direction). In this embodiment, the propagation directions of the 15 light beams, as represented by light beams 30A-30E, are different.

Figure 5B:
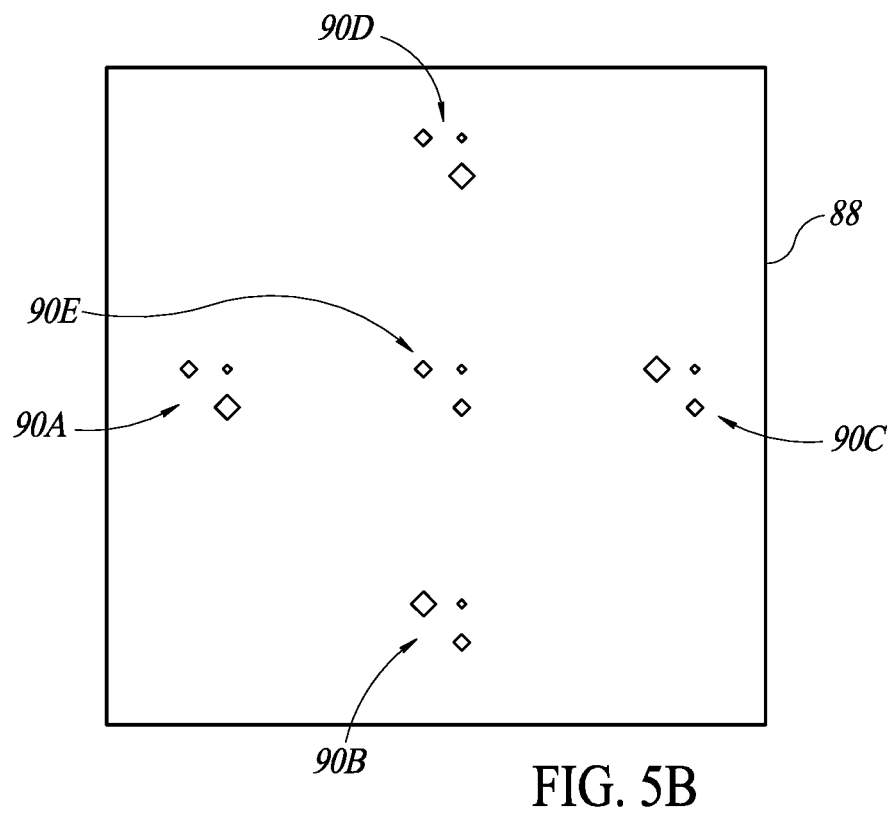
FIG. 5B is a projection of the five collimated light beams emitted from the transmission beam splitter of FIG. 5A onto a target object, according to an embodiment of the present disclosure.

FIG. 5B is a projection of the five collimated light beams 30A-30E emitted from the transmission beam splitter 18 of FIG. 5A onto a target object 88. In this embodiment, the VCSEL light source 16 include the three emitters 54A-54C for generating three light beams (represented by light beam 31 of FIG. 1), each of which are refracted/collimated by each of the five lenslets 64A-64E of the transmission beam splitter 18. As illustrated, the three points 90A represent the illumination of the target object 88 by the three closely spaced collimated light beams 30A, the three points 90B represents the illumination of the target object 88 by the three closely spaced collimated light beams 30B, the three points 90C represents the illumination of the target object 88 by the three closely spaced collimated light beams 30C, the three points 90D represents the illumination of the target object 88 by the three closely spaced collimated light beams 30D, and the three points 90E represents the illumination of the target object 88 by the three closely spaced collimated light beams 30E.

In other embodiments, if the VCSEL light source 16 includes only a single emitter, for example, each collimated light beam 30A-30E would project only one point of light on the target object 88, and if the VCSEL light source 16 includes five emitters, for example, each collimated light beam 30A-30E would project five points of light on the target object 88.

Figure 6:
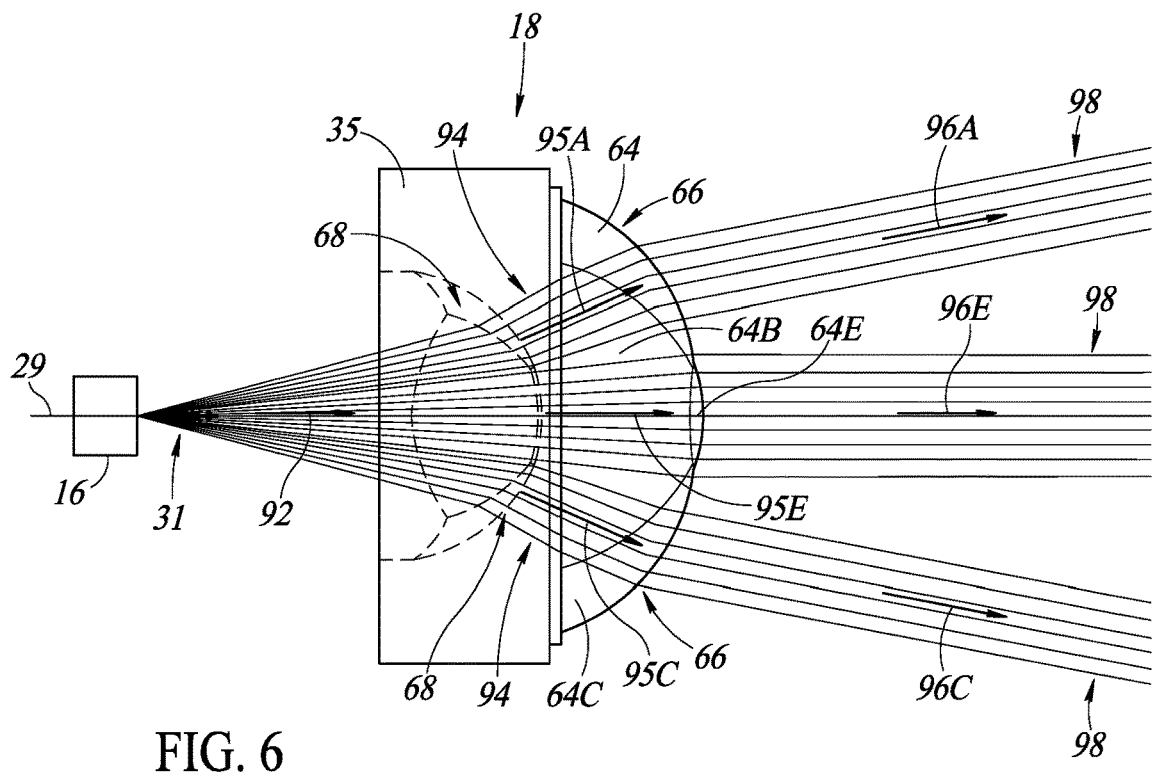
FIG. 6 illustrates refraction of a light beam by inner surfaces and outer surfaces of lenslets of a transmission beam splitter of any of the preceding figures, according to an embodiment of the present disclosure.

FIG. 6 illustrates refraction of light beams by the inner surfaces 68 and outer surfaces 66 of the lenslets 64A-64E of the transmission beam splitter 18, according to an embodiment of the present disclosure. For ease of illustration and explanation, a light source 16 emitting a single light beam 31 is used an exemplary embodiment, and lenslets 64A, 64B, 64C, and 64E are shown. The light source 16 is positioned on the longitudinal axis 29. Each of the inner surfaces 68 are shaped to refract the spherical wavefront of the light beam 31, which has a first propagation direction 92, for forming a first refracted light beam 94 having a second propagation direction. For example, as shown in FIG. 6, the inner surfaces 68 of the lenslets 64A, 64C, and 64E refract the light beam 31 to have second propagation directions 95A, 95C, and 95E, respectively. In one embodiment, each of the first refracted light beams 94 is also propagated as a spherical wavelet. Each of the outer surfaces 66 is shaped to collimate (via refraction) the spherical wavefront of the first refracted light beam 94 for forming a collimated light beam 98 having a planar wavefront propagating in a third propagation direction. For example, as shown in FIG. 6, the outer surfaces 66 of the lenslets 64A, 64C, and 64E refract light beams 94 to have third propagation directions 96A, 96C, and 96E, respectively. In one embodiment, the third propagation direction is different from the second propagation direction (e.g., the third propagation direction 96A is different from the second propagation direction 95A). In another embodiment, the third propagation direction is substantially equal to the second propagation direction (e.g., the third propagation direction 96E is substantially equal to the second propagation direction 95E).

The above-described process of shaping the inner and outer surfaces of a lenslet may be performed for all the lensets 64A-64E for designing the transmission beam splitter 18 to split a light beam 31 received from the light source 18 into m collimated light beams having different propagation directions, where m is the number of lenslets 64A-64D. When the light source 16 has n emitters, then the transmission beam splitter 18 splits the m received light beams into n×m collimated light beams, where each lenslet splits the received m light beams into m collimated light beams.

In one embodiment, the three-dimensional shape of the outer and inner surfaces 66, 68 of each lenslet 64A-64E is based upon the propagation directions of the plurality of collimated light beams (i.e., 96A-96E, FIG. 5A), and/or refractive indices of the plurality of lenslets 64A-64E. The amount a light beam is refracted by surfaces of lenses depends upon the refractive index of the lens and the refractive index of the ambient medium surrounding the lens.

Figure 7:
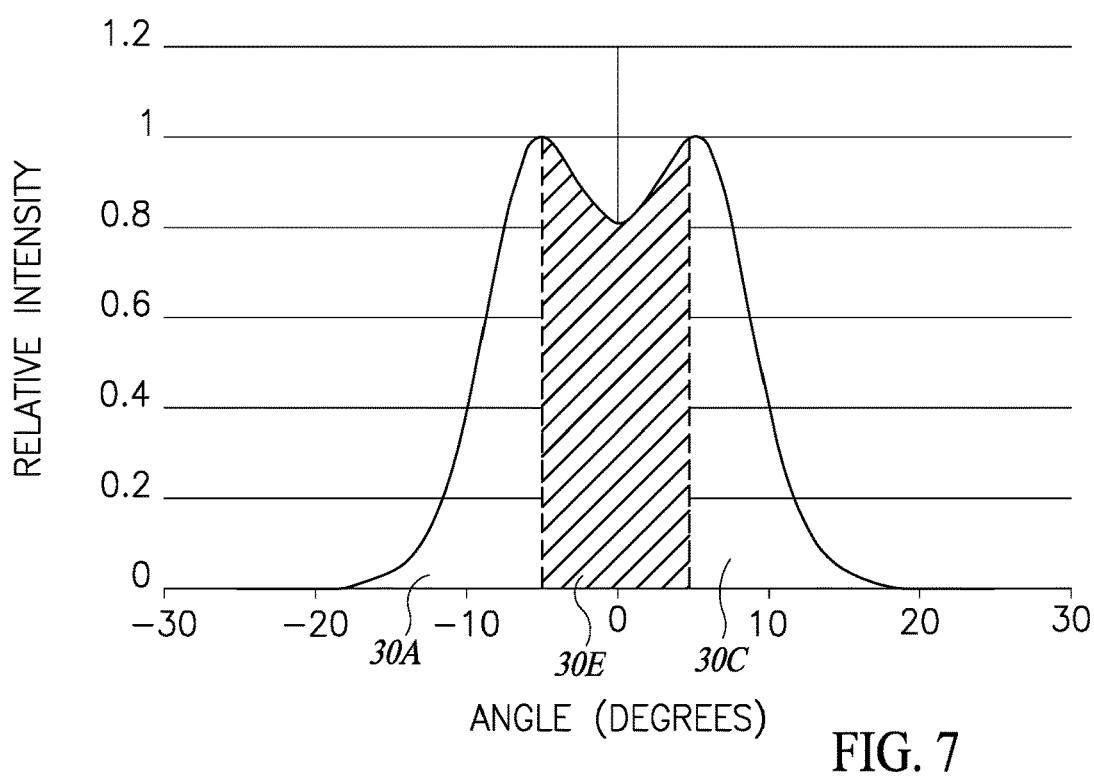
FIG. 7 is a far-field intensity profile of the five collimated light beams emitted from the transmission beam splitter of FIG. 5A, according to an embodiment of the present disclosure.

In some cases, the power output of the light beam 31 transmitted from the VCSEL light source 16 may not be constant radially. To compensate, in one embodiment, the lenslets 64A-64E are sized to adjust the power output of the transmission beam splitter 18. For example, in one embodiment, the lenslets 64A-64E are sized to ensure the power outputs of the collimated light beams 30A-30E are balanced. FIG. 7 is a far-field intensity profile 700 of the collimated light beams 30A, 30C and 30E emitted from the transmission beam splitter 18, according to an embodiment of the present disclosure. In this embodiment, an area of the outer surface 66 and/or the inner surface 68 of the center lenslet 64E (or alternatively the area of the lenslet 64E) is designed to be less than the area of the outer surface 66 and/or the inner surface, respectively, of any peripheral lenslets 64A-64D (or alternatively the area of any peripheral lenses 64A-64D) to reduce the intensity of the one or more collimated light beams 30E emitted from the center lenslet 64E with respect to the intensity of the one or more collimated light beams 30A-30D emitted from any of the peripheral lenslets 64A-64D. For example, and as illustrated in FIG. 7, the intensity of the collimated light beams 30A, 30C provided by the peripheral lenslet 64A, 64C, respectively, as received in the far-field over an angle of approximately −6 to −18 degrees (as measure with respect to the longitudinal axis 29) are greater than the intensity of the collimated light beam provided by the center lenslet 64E as received in the far-field over an angle of approximately −6 to +6 degrees as measure with respect to the longitudinal axis 29. The areas of the surfaces of the lenslets 64A-64E may also be designed to produce far-field illumination profiles different from FIG. 7.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a sensor including a transmission module configured to transmit a plurality of collimated light beams, the transmission module including:
   a light source; and
   a transmission beam splitter including a plurality of lenslets,
   the plurality of lenslets including a center lenslet and a plurality of peripheral lenslets that surround the center lenslet,
   each of the plurality of peripheral lenslets including a first side physically coupled to a first adjacent peripheral lenslet of the plurality of peripheral lenslets, a second side physically coupled to a second adjacent peripheral lenslet of the plurality of peripheral lenslets, and a third side physically coupled to the center lenslet,
   each of the plurality of lenslets configured to receive one or more light beams from the light source and refract the one or more light beams for forming respective collimated light beams of the plurality of collimated light beams, each of the plurality of lenslets including a curved inner surface configured to refract the one or more light beams from a first direction to a second direction, and a curved outer surface configured to refract the one or more light beams from the second direction to a third direction.

2. The device of claim 1, wherein the light source is a vertical-cavity surface-emitting laser (VCSEL).

3. The device of claim 2, wherein the VCSEL includes one or more emitters for generating the one or more light beams.

4. The device of claim 3, wherein the VCSEL includes three emitters.

5. The device of claim 1, wherein the plurality of peripheral lenslets encircle the center lenslet.

6. The device of claim 1, wherein each collimated light beam of the plurality of collimated light beams has a propagation direction, and wherein each propagation direction is different from each other propagation direction.

7. The device of claim 6, wherein shapes of the curved inner and outer surfaces of each lenslet is based upon one or more of: propagation directions of the plurality of collimated light beams, and refractive indices of the plurality of lenslets.

8. The device of claim 1, wherein the center lenslet is positioned symmetrically on a longitudinal axis.

9. The device of claim 8, wherein an area of the curved outer surface of the center lenslet is less than an area of the curved outer surface of any of the plurality of peripheral lenslets.

10. The device of claim 8, wherein shapes of the curved inner and outer surfaces of the center lenslet is configured such that the one or more light beams from the light source passing through the center lenslet are refracted to form one or more respective collimated light beams propagating approximately parallel to the longitudinal axis.

11. The device of claim 1, wherein the sensor further includes a receiving module configured to receive a plurality of light beams, wherein the plurality of light beams are reflections of the plurality of collimated light beams from one or more objects, and wherein the sensor further includes a processor configured to determine distances from the sensor to the one or more objects based on a time-of-flight analysis for each the plurality of collimated light beams.

12. The device of claim 1, wherein
the curved inner surface of each of the plurality of peripheral lenslets is configured to refract the one or more light beams from the first direction to the second direction, which is different from the first direction,
the curved outer surface of each of the plurality of peripheral lenslets is configured to refract the one or more light beams from the second direction to the third direction, which is different from the second direction,
the curved inner surface of the center lenslet is configured to refract the one or more light beams from the first direction to the second direction, which is the same as the first direction, and
the curved outer surface of the center lenslet is configured to refract the one or more light beams from the second direction to the third direction, which is the same as the second direction.

13. The device of claim 1 wherein the respective collimated light beams having different propagation directions.

14. A device, comprising:
a light source including one or more emitters for generating one or more light beams; and
a transmission beam splitter including a plurality of lenslets,
each of the plurality of lenslets configured to receive the one or more light beams and generate one or more respective collimated light beams,
the plurality of lenslets including a center lenslet and a plurality of peripheral lenslets,
each of the plurality of peripheral lenslets including a first side physically coupled to a first adjacent peripheral lenslet of the plurality of peripheral lenslets, a second side physically coupled to a second adjacent peripheral lenslet of the plurality of peripheral lenslets, and a third side physically coupled to the center lenslet,
each of the plurality of lenslets includes curved inner surface configured to refract the one or more light beams from a first direction to a second direction, and curved outer surface configured to refract the one or more light beams from the second direction to a third direction,
the one or more light beams enter each of the plurality of lenslets through the curved inner surface and exit each of the plurality of lenslets through the curved outer surface.

15. The device of claim 14, wherein the center lenslet is positioned on a longitudinal axis of the transmission beam splitter.

16. A transmission beam splitter having a longitudinal axis, the transmission beam splitter comprising:
a circular base portion; and
a top portion on the circular base portion, the top portion having a plurality of lenslets including:
a center lenslet positioned on the longitudinal axis; and
a plurality of peripheral lenslets positioned circumferentially around the longitudinal axis,
wherein each of the plurality of peripheral lenslets includes a top edge connecting with a portion of a circumferential edge of the center lenslet, and a bottom edge connecting with a portion of a circumferential edge of the circular base portion;
wherein each of the plurality of peripheral lenslets includes two side edges,
wherein each side edge of each of the plurality of peripheral lenslets connects with a side edge of an adjacent peripheral lenslet,
wherein each of the plurality of lenslets includes an inner surface and an outer surface, and shapes of the outer and inner surfaces of each of the plurality of lenslets is configured such that one or more light beams passing through each lenslet are refracted to form one or more respective collimated light beams, the one or more respective collimated light beams having different propagation directions, and
wherein a shape of the inner surface of each of the plurality of lenslets is curved to refract the one or more light beams from a first direction to a second direction, and a shape of the outer surface of each of the plurality of lenslets is curved to refract the one or more light beams from the second direction to a third direction.

17. The transmission beam splitter of claim 16 wherein the outer surface of each of the plurality of peripheral lenslets is larger than the outer surface of the center lenslet.

* * * * *